United States Patent
Ohtani et al.

(10) Patent No.: US 10,840,141 B2
(45) Date of Patent: Nov. 17, 2020

(54) WORKPIECE-SEPARATING DEVICE AND WORKPIECE-SEPARATING METHOD

(71) Applicant: SHIN-ETSU ENGINEERING CO., LTD., Tokyo (JP)

(72) Inventors: Yoshikazu Ohtani, Gunma (JP); Kyouhei Tomioka, Gunma (JP)

(73) Assignee: SHIN-ETSU ENGINEERING CO., LTD., Tokyo (JP)

( * ) Notice: Subject to any disclaimer, the term of this patent is extended or adjusted under 35 U.S.C. 154(b) by 0 days.

(21) Appl. No.: 16/755,341

(22) PCT Filed: Jun. 12, 2019

(86) PCT No.: PCT/JP2019/023269
§ 371 (c)(1),
(2) Date: Apr. 10, 2020

(87) PCT Pub. No.: WO2019/244742
PCT Pub. Date: Dec. 26, 2019

(65) Prior Publication Data
US 2020/0312716 A1    Oct. 1, 2020

(30) Foreign Application Priority Data

Jun. 18, 2018  (JP) .................................. 2018-115399

(51) Int. Cl.
*H01L 21/78*   (2006.01)
*B23K 26/04*   (2014.01)
(Continued)

(52) U.S. Cl.
CPC ............ *H01L 21/78* (2013.01); *B23K 26/048* (2013.01); *B23K 26/57* (2015.10); *H01L 21/02076* (2013.01); *H01L 21/268* (2013.01)

(58) Field of Classification Search
None
See application file for complete search history.

(56) References Cited

U.S. PATENT DOCUMENTS

2013/0119031 A1*  5/2013  Matsuda ............. H01L 33/0093
                                                                  219/121.85
2017/0103925 A1*  4/2017  Jhon ........................ H01L 21/52
(Continued)

FOREIGN PATENT DOCUMENTS

JP    2012-24783 A    2/2012
JP    2012-191112 A   10/2012
(Continued)

OTHER PUBLICATIONS

Office Action for corresponding Japanese patent application No. 2019-543864 dated Oct. 8, 2019 and English translation thereof.
(Continued)

*Primary Examiner* — Alexander G Ghyka
(74) *Attorney, Agent, or Firm* — Greenblum & Bernstein, P.L.C.

(57) ABSTRACT

A workpiece-separating device includes: a holding member that detachably holds a workpiece among a layered body in which the workpiece that includes a circuit board and a supporting body that allows laser beams to pass therethrough are layered with each other via a separating layer that peelably alters with absorption of the laser beams; a laser irradiation part that performs irradiation of Gaussian beams pulse-oscillated as the laser beams toward the separating layer through the supporting body of the layered body held by the holding member; and a controlling part that controls an operation of the laser irradiation part, wherein the controlling part controls a distance between centers of the adjacent Gaussian beams of the laser beams pulse-oscillated from the laser irradiation part to be less than three times of a standard deviation when a relationship between a beam diameter and irradiation intensity is assumed as a normal distribution.

4 Claims, 6 Drawing Sheets

(51) Int. Cl.
    *H01L 21/268*    (2006.01)
    *B23K 26/57*    (2014.01)
    *H01L 21/02*    (2006.01)

(56) References Cited

U.S. PATENT DOCUMENTS

| | | | |
|---|---|---|---|
| 2018/0161921 A1* | 6/2018 | Morikazu | B23K 26/043 |
| 2019/0160598 A1* | 5/2019 | Shreter | B23K 26/57 |
| 2020/0001393 A1* | 1/2020 | Philippron | B23K 26/36 |
| 2020/0049552 A1* | 2/2020 | Hackert | G01J 1/44 |
| 2020/0135599 A1* | 4/2020 | Liang | H01L 23/3114 |
| 2020/0230748 A1* | 7/2020 | Ikeno | B23K 26/53 |

FOREIGN PATENT DOCUMENTS

| | | |
|---|---|---|
| JP | 2018-6487 A | 1/2018 |
| WO | 2017-110121 A1 | 6/2017 |

OTHER PUBLICATIONS

International Search Report issued in International Patent Application No. PCT/JP2019/023269, dated Jul. 9, 2019 and English translation thereof.

Written Opinion issued in International Patent Application No. PCT/JP2019/023269, dated Jul. 9, 2019, and English translation thereof.

Aug. 24, 2020 Korean Office Action for corresponding Korean patent application No. 10-2020-7011710 and English translation thereof.

Sep. 3, 2020 Chinese Office Action for corresponding Chinese patent application No. 201980005186.0 and English translation thereof.

\* cited by examiner

WORKPIECE-SEPARATING DEVICE AND WORKPIECE-SEPARATING METHOD

TECHNICAL FIELD

The present invention relates to a workpiece-separating device and a workpiece-separating method using a workpiece-separating device that are used to peel a workpiece temporarily fixed to and held by a supporting body from the supporting body in the process of manufacturing a workpiece as a product, such as WLP (wafer level packaging), PLP (panel level packaging), and a treatment process for a semiconductor wafer having an ultrathin thickness.

BACKGROUND ART

Conventional examples of such a workpiece-separating device and a workpiece-separating method include a supporting body separation method for separating a supporting body from a layered body in which a substrate and the supporting body that allows light to pass therethrough are layered with each other via a separating layer that alters with the absorption of light; and a supporting body separation device for performing such a supporting body separation method (see, for example, PTL 1).

The supporting body separation method includes: a light irradiation process of performing the irradiation of the separating layer with light via the supporting body while holding the layered body by suction; a separation process of separating the supporting body from the layered body subsequent to the light irradiation process; and a carry process of carrying out the substrate from which the supporting body has been separated from the supporting body separation device.

The supporting body separation device includes: a holding base that holds a layered body; and a laser irradiation part that serves as a light irradiation part. The holding base has a holding face including an adsorption part that adsorbs the layered body and a pressing part that presses the layered body against the holding base. Laser beams corresponding to a wavelength capable of being absorbed by the separating layer are used as the light to irradiate the separating layer, emitted from the laser irradiation part, and their laser outputs and pulse frequencies are adjusted according to conditions such as the type and thickness of the separating layer and the type of the substrate.

In addition, a substrate treatment method for treating the substrate having been separated from the layered body according to the supporting body separation method includes: a cleaning process of removing residues of the separating layer remaining on the substrate and containing an adhesive agent while holding the substrate having been separated from the layered body by suction; and a dicing process of dicing the substrate isolated after the cleaning process while holding the same by suction.

CITATION LIST

Patent Literature

[PTL 1] Japanese Patent Application Laid-open No. 2018-006487

SUMMARY OF INVENTION

Technical Problem

Meanwhile, it has not been easy to make the irradiation intensity with the laser beams uniform with respect to the separating layer of the layered body and has been really difficult to perform the irradiation of the laser beams uniformly on the separating layer to be separated (peeled).

However, PTL 1 does not describe any detailed control method for performing the irradiation of the layered body with the laser beams.

Therefore, if scanning is performed in a state where the energy of pulsed laser beams emitted from the laser irradiation part to irradiate the separating layer is excessively larger in amount than a required amount for separating the separating layer, the irradiation with the laser beams becomes excessive for a part of the separating layer. As a result, there is a possibility that temperatures partially increase at some positions to cause heat generation due to the excessive irradiation.

This causes problems such as a burn and soot caused at portions at which the laser energy is excessive in the separating layer and damage on a device formed in the circuit board of a chip mounted in the substrate.

Solution to Problem

In order to solve the above problems, a workpiece-separating device according to the present invention includes: a holding member that detachably holds a workpiece in a layered body in which the workpiece that includes a circuit board and a supporting body that allows laser beams to pass therethrough are layered with each other via a separating layer that peelably alters with absorption of the laser beams; a laser irradiation part that performs irradiation of the separating layer with Gaussian beams pulse-oscillated as the laser beams through the supporting body of the layered body held by the holding member; and a controlling part that controls an operation of the laser irradiation part, wherein the controlling part controls a distance between centers of the adjacent Gaussian beams of the laser beams pulse-oscillated from the laser irradiation part to be less than three times of a standard deviation when a relationship between a beam diameter and irradiation intensity in a beam profile of the Gaussian beams is assumed as a normal distribution.

Further, in order to solve the above problems, a workpiece-separating method according to the present invention includes: a holding process of detachably holding a workpiece on a holding member in a layered body wherein the workpiece that includes a circuit board and a supporting body that allows laser beams to pass therethrough are layered with each other via a separating layer that peelably alters with absorption of the laser beams; and a laser irradiation process of irradiating the separating layer with the laser beams emitted from the laser irradiation part through the supporting body of the layered body held by the holding member, wherein, in the laser irradiation process, irradiation with Gaussian beams pulse-oscillated as the laser beams are emitted from the laser irradiation part for irradiation, and a distance between centers of the adjacent Gaussian beams is set to be less than three times of a standard deviation when a relationship between a beam diameter and irradiation intensity in a beam profile of the Gaussian beams is assumed as a normal distribution.

BRIEF DESCRIPTION OF DRAWINGS

FIGS. 5(a) to 5(c) are the beam profiles of the pulsed laser beams, where

FIGS. 6(a) to 6(d) are explanatory views (in which lower columns are beam profiles and upper columns are plan views) showing the irradiated point arrangement irradiated with the pulsed laser beams, where

DESCRIPTION OF EMBODIMENTS

An embodiment of the present invention will be described in detail below on the basis of the drawings.

As shown in FIGS. 1 to 6, a workpiece-separating device A and a workpiece-separating method according to the embodiment of the present invention are a device and a method of irradiating a separating layer 3 with laser beams L through a supporting body 2 to a layered body S, in which a workpiece 1 that includes a circuit board (not shown) and the supporting body 2 that allows the laser beams L to pass therethrough are layered with each other via the separating layer 3 that peelably alters with the absorption of the laser beams L, to peel the supporting body 2 from the workpiece 1. The workpiece-separating device A and the workpiece-separating method are used for manufacturing semiconductor packages or the like as seen in WLP (wafer level packaging) and PLP (panel level packaging) or treatment processes for semiconductor wafers (called "ultrathin wafers" below) having an ultrathin thickness.

More specifically, the workpiece-separating device A according to the embodiment of the present invention includes as its main constituents: a holding member 10 provided to detachably hold the workpiece 1 of the layered body S; and a laser irradiation part 22 of an optical system 20 provided to perform the irradiation of the separating layer 3 with the laser beams L emitted from a laser source 21 through the supporting body 2. In addition, the workpiece-separating device A preferably includes: a driving part 30 provided to relatively move laser irradiation positions P with light emitted from the laser irradiation part 22 with respect to the supporting body 2 and the separating layer 3 in at least two directions crossing a light irradiation direction from the laser irradiation part 22; a length measuring part 40 provided to measure distances from the laser irradiation part 22 to the irradiated face of the supporting body 2 and the separating layer 3; and a controlling part 50 provided to control the operation of the laser irradiation part 22, the driving part 30, the length measuring part 40, or the like.

Note that as shown in FIGS. 1 to 6, the layered body S is generally placed in a vertical direction with respect to the holding member 10, and the layered body S on the holding member 10 is irradiated with the laser beams L emitted downward from the laser irradiation part 22. The holding direction of the layered body S with respect to the holding member 10 or the irradiation direction from the laser irradiation part 22 toward the layered body S irradiated with the laser beams L will be called a "Z direction" below. The two directions that are relative moving directions by the driving part 30 and cross the irradiation direction (Z direction) irradiated with the laser beam L will be called "X and Y directions" below.

The workpiece 1 is a rectangular (panel-shaped) substrate or a circular wafer that includes a circuit board having been subjected to a semiconductor process such as circuit formation treatment and thinning treatment and that is carried in a layered state in which the workpiece 1 is bonded to the supporting body 2 that will be described later, and is formed into a thin plate shape using a material such as silicon. As a specific example of the workpiece 1, a substrate or a wafer thinned to a thickness of, for example, 15 to 3,000 μm is used. Particularly, when the workpiece 1 has a thickness on the order of several tens of micrometers like an ultrathin wafer or the like, it is also possible to bond the whole face of the workpiece 1 to a tape-shaped holding adhesive sheet such as a dicing tape to be supported or bond the workpiece 1 to a tape-shaped holding adhesive sheet with its outer peripheral part reinforced by a ring-shaped holding frame such as a dicing frame to be supported.

The supporting body 2 is called a support substrate or a carrier substrate having such strength as to support the workpiece 1 in a thinning process, a carrying process, or the like for the workpiece 1 to prevent the breakage, deformation, or the like of the workpiece 1. The supporting body 2 is formed of a transparent or semi-transparent rigid material such as a glass and a synthetic resin that allows the laser beams L having a specific wavelength to pass therethrough. As a specific example of the supporting body 2, a transparent or semi-transparent glass plate, ceramic plate, acrylic-based resin plate, or the like having a thickness of, for example, 300 to 3,000 μm is used.

The separating layer 3 is a layer that alters to reduce adhesivity with the absorption of the laser beams L to irradiate after passing through the supporting body 2, and that loses an adhesive property and peels or alters to be capable of being destroyed with the reception of a slight external force.

As the material of the separating layer 3, a material that has an adhesive property like, for example, a polyimide resin and makes it possible to bond the workpiece 1 and the supporting body 2 to each other without the interposition of an adhesive layer formed of an adhesive agent is preferably used. In addition, it is also possible to make another layer that can be easily cleaned and removed to be layered after the supporting body 2 is peeled from the workpiece 1. Further, when the separating layer 3 is formed of a material having no adhesive property, it is required to provide an adhesive layer (not shown) formed of an adhesive agent between the separating layer 3 and the supporting body 2 and adhere the separating layer 3 and the supporting body 2 to each other with the adhesive layer.

The layered body S is formed into a rectangular (right-angled quadrangle including a rectangle and a square) panel-shape or circular shape that is large in size in the X and Y directions but thin in the Z direction.

An example shown in FIGS. 1(a) and 1(b) and FIGS. 2(a) to 2(d) shows the case of the layered body S having a panel shape in which a rectangular substrate that serves as the workpiece 1 and a rectangular support substrate (carrier substrate) that serves as the supporting body 2 are bonded to each other by the separating layer 3.

An example shown in FIG. 3 shows the case of the layered body S having a circular shape in which a circular wafer that serves as the workpiece 1 and a circular support substrate (carrier substrate) that serves as the supporting body 2 are bonded to each other by the separating layer 3.

Further, particularly when the workpiece 1 has a thickness on the order of several tens of micrometers like an ultrathin wafer, another example includes, although not shown, the layered body S in a mode in which the workpiece 1 is bonded to a tape-shaped holding adhesive sheet (dicing tape) with its outer peripheral part reinforced by a ring-shaped holding frame (dicing tape).

Although not shown, a specific example of the layered body S includes a panel-type layered body or the like manufactured by a Fan-out-type PLP technology, in which a sealing body that has a plurality of semiconductor elements mounted on the workpiece 1 and is sealed by a sealing material such as a resin and the panel-shaped supporting body 2 are layered with each other via the separating layer 3. The sealing body including the plurality of semiconductor elements is finally cut off in the X and Y directions by dicing or the like and then subjected to a final process in which an electrode extraction part is attached via a rewiring layer or the like, whereby a plurality of electronic components are manufactured as final products.

The holding member 10 is composed of a surface plate or the like having such a thickness as not to be distorted (deflected) and deformed by a rigid body such as metal, formed into a substantially rectangular or circular flat-plate shape larger than the outside dimension of the layered body S and thick, and provided with a holding chuck 11 for the workpiece 1 at its holding face that faces the layered body S in the Z direction.

The holding chuck 11 is used to immovably and detachably hold the workpiece 1 in a contacting state and formed in the whole or a part of the holding face that faces the layered body S in the Z direction.

As a specific example of the holding chuck 11, an adsorption chuck in which the workpiece 1 is adsorbed and held by a differential pressure generated by suction is preferably used. Among adsorption chucks, a porous chuck in which the workpiece 1 is adsorbed by a differential pressure through an adsorption face formed of a porous material is particularly preferably used. In the case of a porous chuck, it is possible to adsorb the workpiece 1 by a differential pressure without making the whole workpiece 1 partially deflected. Therefore, a uniform holding state can be maintained.

Further, as another example of the holding chuck 11, it is also possible to use an adhesive chuck or an electrostatic chuck instead of an adsorption chuck or use some of an adsorption chuck, an adhesive chuck, and an electrostatic chuck in combination.

Note that although not shown, other examples of the holding member 10 include a holding member having a structure in which the whole layered body S is fixed (immovably and detachably held) via the workpiece 1 by a plurality of support pins instead of a flat-plate-shaped holding face. In this case, the workpiece 1 is preferably configured to be capable of being adsorbed and fixed by the tips of a part or the whole of the plurality of support pins.

The laser irradiation part 22 is provided as a part of the optical system 20 that guides the laser beams L from the laser source 21 toward the targeted laser irradiation positions P. The laser irradiation part 22 is arranged to face the layered body S held by the holding member 10 in the Z direction and scans the layered body S. Thus, the whole face of the separating layer 3 is irradiated with the laser beams L guided by the optical system 20 through the supporting body 2 of the layered body S.

As the laser beams L emitted from the laser irradiation part 22 to irradiate the layered body S, pulsed laser beams that have a wavelength passing through the supporting body 2 and capable of being absorbed by the separating layer 3 and that are to be pulse-oscillated are used. Among pulsed laser beams L, it is preferable to use laser beams having a spot (dot) shape that easily achieve higher output laser beams rather than using laser beams having a line (slit) shape as their projected shapes.

In contrast, it is not preferable to use continuously-oscillated laser beams (continuous wave laser) because they are susceptible to heat caused by laser energy absorbed into the separating layer 3.

Besides this, as the laser beams (pulsed laser beams) L emitted from the laser irradiation part 22 for irradiation, Gaussian beams are pulse-oscillated like beam profiles shown in FIG. 4(a) or FIGS. 5(a) to 5(c), and a distance D between the centers of the adjacent Gaussian beams is capable of being set at a desired oscillating timing by the controlling part 50 that will be described later. Note that in the beam profiles shown in FIGS. 4(a) and 4(b) and FIGS. 5(a) to 5(c), a vertical axis shows irradiation intensity (beam intensity) W with the laser beams (pulsed laser beams) L, and a horizontal axis shows the distance between positions (laser irradiation positions P) of the separating layer 3 irradiated with pulse-oscillated Gaussian beam lights.

The Gaussian beams are not required to be subjected to optical conversion by a beam profiler or the like and are conventionally generally used electromagnetic waves capable of being used for irradiation as they are.

Figure 4A:
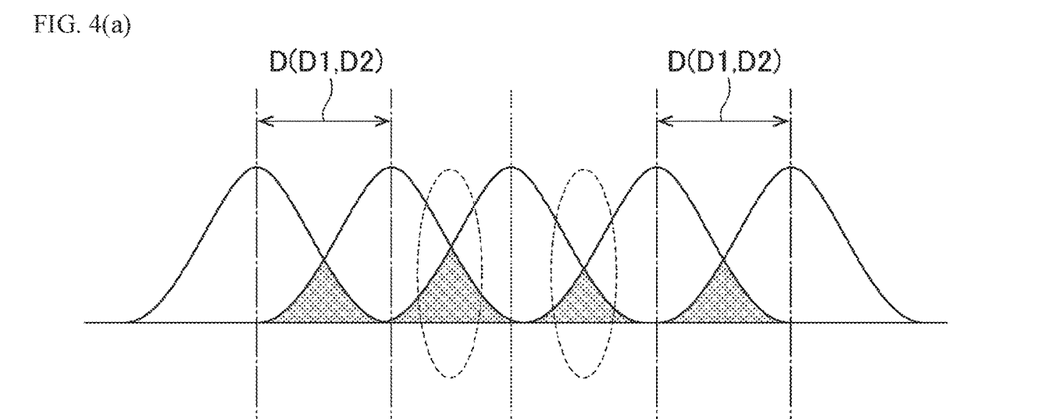
FIGS. 4(a) and 4(b) are the beam profiles of pulsed laser beams, FIG. 4(a) showing a beam profile obtained when Gaussian beams are pulse-oscillated as laser beams, FIG. 4(b) showing a beam profile obtained when the Gaussian beams are changed to a pseudo top hat.
Figure 4B:
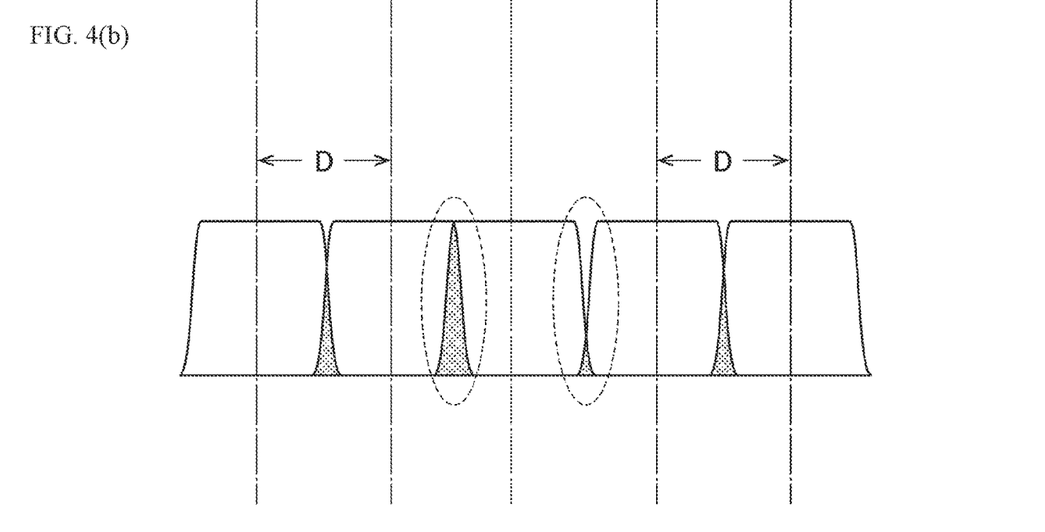

Further examples thereof include, as shown in a beam profile shown in FIG. 4(b), a method of irradiation with beams having substantially uniform irradiation intensity, in which the shape of the laser beams is changed with a diffraction optical element (DOE) to change the beam profile of the Gaussian beams into a substantially quadrangular pseudo top hat.

The comparison between the beam profile of the Gaussian beams and the beam profile of the pseudo top hat shows that the Gaussian beams in FIG. 4(a) have irradiation intensity (pulse power) not greatly different at portions at which the adjacent Gaussian beams overlap each other and are emitted for irradiation in a substantially uniform state at all the laser irradiation positions P even if the distance D between the centers of the adjacent Gaussian beams is deviated due to a slight deviation in an oscillation timing for irradiation with beam.

In contrast, the pseudo top hat in FIG. 4(b) causes extremely large irradiation intensity (pulse power) at portions at which adjacent pseudo top hat beams overlap each other if the distance D between the centers of the adjacent Gaussian beams is even slightly deviated, and there is a possibility that temperatures partially increase at laser irradiation positions P corresponding to the overlapped portions to cause heat generation.

Figure 1A:
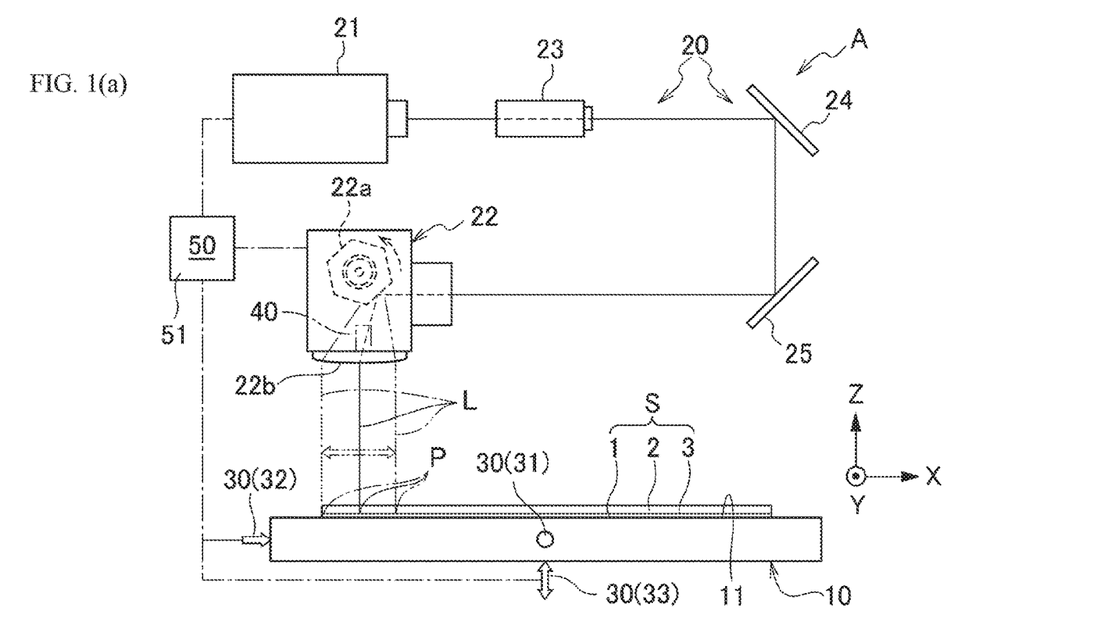
FIGS. 1(a) and 1(b) are explanatory views showing the entire configuration of a workpiece-separating device according to an embodiment of the present invention, FIG. 1(a) being a front view, FIG. 1(b) being a traverse plan view.

In a case shown in FIG. 1(a) as a specific example of the optical system 20 and the laser irradiation part 22, the beam diameter of the laser beams L generated by a laser oscillator that serves as the laser source 21 of the laser beams L is adjusted through a beam expander 23, and the direction of the laser beams L is changed by reflecting mirrors 24 and 25 such as steering mirrors. Then, the laser beams L are guided to a laser scanner that serves as the laser irradiation part 22 and travels for irradiation as the laser beams L having an ultrashort pulse toward targeted positions of the layered body S held by the holding member 10.

As shown in FIG. 1(a) or the like, the laser irradiation part (laser scanner) 22 has a polygon scanner 22a rotatably provided and a lens 22b composed of an fθ lens or the like. The polygon scanner 22a has a mirror part arranged to have a regular N-sided polygon around a rotationally-driven cylinder, and is configured to scan the layered body S in such a manner as to cause the incident laser beams L to collide with the rotationally-driven mirror part to be reflected and convert the reflected laser beams L into a light path substantially perpendicular to the layered body S using the lens 22b. In performing scanning based on the rotational driving of the polygon scanner 22a, the laser beams L are moved by a prescribed width in a linear direction parallel to a direction (X direction) in which the laser beams are to be incident on the mirror part having the regular N-side polygon.

Further, although not shown as another example, it is possible to perform alterations such as combining the polygon scanner 22a and a Galvano scanner or the like together and moving a reflecting mirror (Galvano mirror) with a Galvano scanner instead of the polygon scanner 22a that serves as the laser irradiation part 22 in each of the X direction and the Y direction by a prescribed width.

The irradiated point arrangement, the regions, the order, or the like of the laser beams L that are emitted from the laser irradiation part 22 to irradiate the supporting body 2 and the separating layer 3 of the layered body S held by the holding member 10 is controlled by the controlling part 50 that will be described later.

Regarding the irradiated point arrangement of the laser beams L controlled by the controlling part 50, it is preferable to perform the irradiation of the separating layer 3 in the linear direction along the irradiated face of the separating layer 3 with the laser beams L pulse-oscillated from the laser irradiation part 22 intermittently a plurality of times at a prescribed distance and the pulsed laser beams L to irradiate the plurality of laser irradiation positions P partially overlap each other to be continuous as shown in FIGS. 6(a) to 6(d). Here, the "linear direction" represents the scanning direction of the laser irradiation part (laser scanner) 22, i.e., a scanning direction (X direction) based on the rotational driving of the polygon scanner 22a in the example shown in the figures. It is preferable to make parts of the pulsed laser beams L intermittently emitted for irradiation at a prescribed distance in the scanning direction (X direction) overlap each other to be linearly continuous.

Figure 1B:
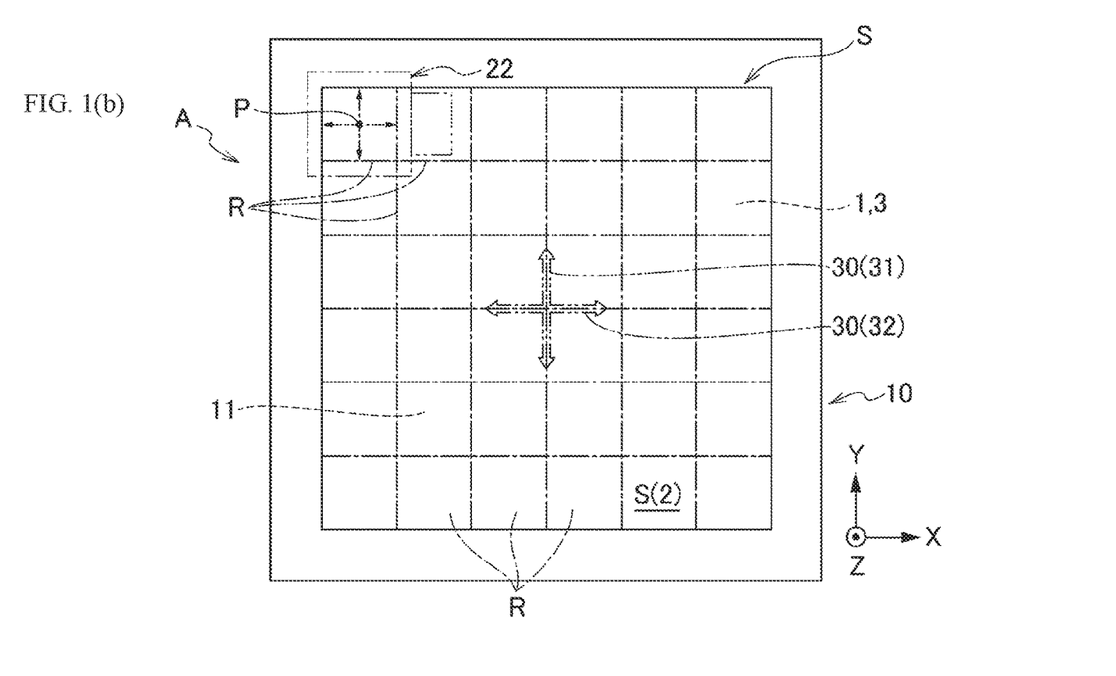
Figure 2A:
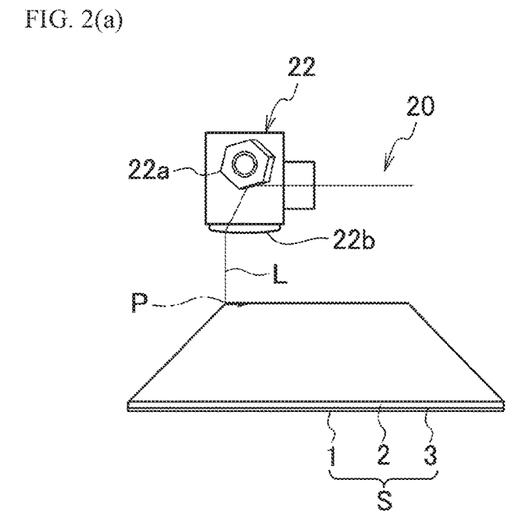
FIGS. 2(a) to 2(d) are explanatory views showing a workpiece-separating method, each of FIGS. 2(a) to 2(d) being a partially-cut-away perspective view showing the process of irradiation with light from a laser irradiation part.
Figure 2B:
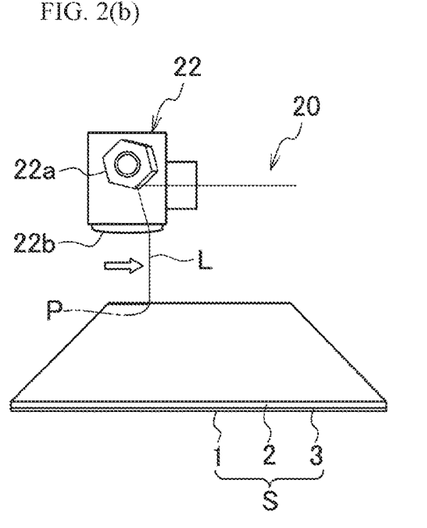
Figure 2C:
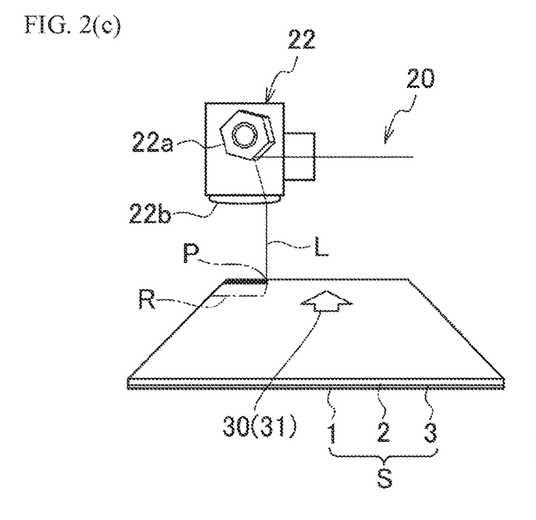
Figure 2D:
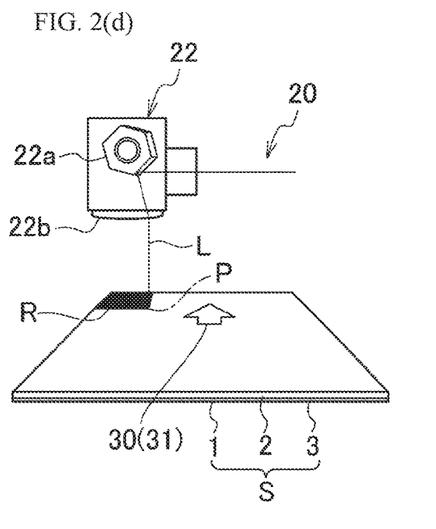
Figure 3A:
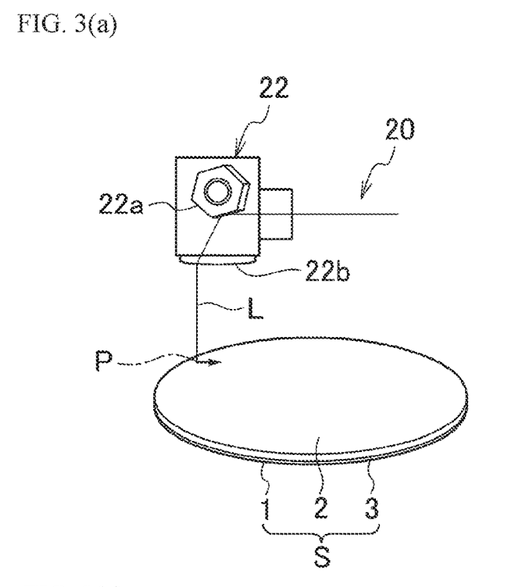
FIGS. 3(a) to 3(d) are explanatory views showing a modified example of a layered body, each of FIGS. 3(a) to 3(d) being a partially-cut-away perspective view showing the process of irradiation with light from the laser irradiation part.
Figure 3B:
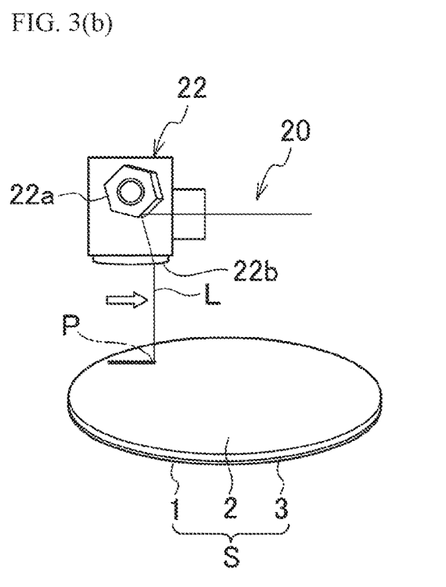
Figure 3C:
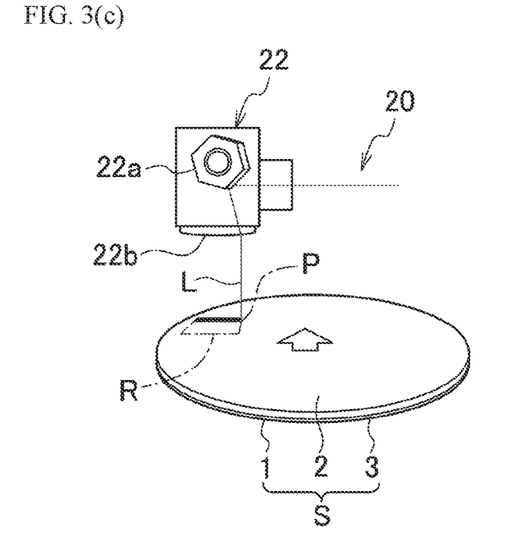
Figure 3D:
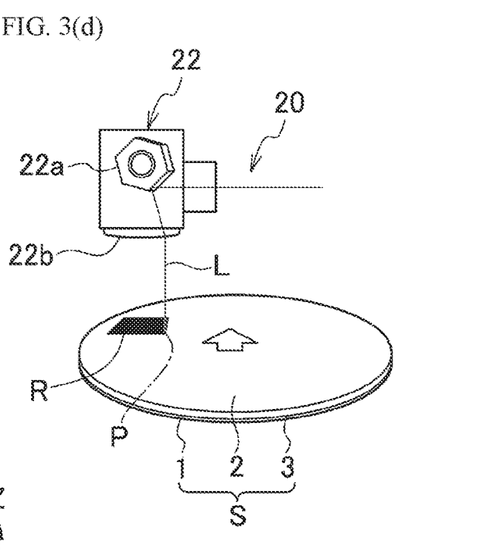

As to the irradiated regions irradiated with the laser beams L and controlled by the controlling part 50, the whole irradiated face of the supporting body 2 and the separating layer 3 is preferably divided into a plurality of irradiation regions R as shown in FIG. 1(b) or FIGS. 2 and 3, and each of the irradiation regions R (for each of unit irradiation regions) among the plurality of irradiation regions R is preferably irradiated with the laser beams L emitted from the laser irradiation part 22.

More specifically, the plurality of irradiation regions R are preferably divided into regions having an area smaller than the whole area of the supporting body 2 and the separating layer 3, and each of the divided irradiation regions R preferably has a rectangular shape (quadrangular shape) such as a square. The divided directions (arrayed directions) of the plurality of irradiation regions R are preferably the X direction and the Y direction same as relative moving directions by the driving part 30 that will be described later, and the size of the plurality of irradiation regions R is preferably set to be adjustable by the controlling part 50 that will be described later.

The order of irradiating the plurality of irradiation regions R with the laser beams L emitted from the laser irradiation part 22 is preferably an arbitrarily-set order to irradiate the whole faces of the respective irradiation region R with the laser beams L emitted from the laser irradiation part 22.

In addition, as shown in FIG. 1(a) or FIGS. 2 and 3, the irradiation angles of the laser beams L emitted from the laser irradiation part 22 to irradiate the layered body S are preferably set to be substantially perpendicular to the supporting body 2 or the separating layer 3 of the layered body S held by the holding member 10. Here, the "substantially perpendicular" is not limited to 90 degrees with respect the face of the supporting body 2 or the separating layer 3 but includes angles in the neighborhood of 90 degrees.

The driving part 30 is an optical-axis relative moving mechanism that is configured to move one or both of the holding member 10 and the laser irradiation part 22 to relatively move the laser beams L emitted from the laser irradiation part 22 for irradiation in the X and Y directions or the Z direction with respect to the supporting body 2 and the separating layer 3 of the layered body S held by the holding member 10.

The optical-axis relative moving mechanism that serves as the driving part 30 includes a workpiece-side moving type that mainly moves the layered body S and an optical-axis-side moving type that moves the laser irradiation part 22.

In the case of the workpiece-side moving type, the driving part 30 is provided in the holding member 10 as shown in FIGS. 1(a) and 1(b). The driving part 30 moves the holding member 10 in the X and Y directions or the Z direction to move the laser irradiation positions P of the laser irradiation part 22 in the X and Y directions or the Z direction. In this case, an X-Y stage, an X-Y table, or the like is used as the driving part 30, and the driving part 30 has a Y-axis moving mechanism 31 and an X-axis moving mechanism 32 composed of a motor shaft or the like. In addition, a Z-axis moving mechanism 33 that moves the holding member 10 in the Z direction is preferably provided as required.

In a case shown in FIGS. 1 to 6 as a specific example of the driving part 30, the holding member 10 is moved in the X and Y directions or the Z direction, besides scanning in the X direction of the laser beams L based on the rotational driving of the polygon scanner 22a.

Further, in the case of the optical-axis-side moving type, the driving part 30 is provided in only a part of the optical system 20 although not shown, and the optical-axis-side moving type is configured to move the laser irradiation positions P of the laser irradiation part 22 in the X and Y directions or the Z direction without the movement of the holding member 10. In order to cause the laser irradiation positions P to relatively move in the Z direction in this case, a Z-axis moving mechanism 33 is provided in the holding member 10 or the laser irradiation part (laser scanner) 22 is moved in the Z direction by the driving part 30.

The length measuring part 40 is composed of a non-contact-type displacement gauge, a non-contact-type displacement sensor, or the like that measures an irradiation distance from the laser irradiation part 22 to the irradiated face of the supporting body 2 or the separating layer 3 of the layered body S held by the holding member 10, and is arranged to face the layered body S held by the holding member 10 in the Z direction.

In a case shown in FIG. 1(a) as a specific example of the length measuring part 40, it is preferable to provide a laser displacement gauge that serves as the length measuring part 40 in the laser irradiation part (laser scanner) 22, measure a length in the Z direction from the laser irradiation part (laser scanner) 22 to the irradiated face of the separating layer 3, and output the measurement value to the controlling part 50 that will be described later.

Further, although not shown in the figures as another example, it is also possible to use a displacement gauge or a displacement sensor other than a laser displacement gauge as the length measuring part 40.

The controlling part 50 is a controller electrically connected to each of the driving source of the holding chuck 11 of the holding member 10, the optical system 20, the laser source 21 and the laser irradiation part 22 of the laser beams L, the light-axis moving mechanism that serves as the driving part 30, and the length measuring part 40.

In addition, the controlling part 50 is the controller electrically connected also to a carry-in mechanism (not shown) that carries the layered body S before separation toward the holding member 10, a peeling mechanism (not shown) that holds only the supporting body 2 and peels the same from the layered body S after light irradiation, a carry-out mechanism (not shown) that carries the layered body S (workpiece 1) after peeling from the holding member 10, or the like.

The controller that serves as the controlling part 50 successively controls each operation at a prescribed timing according to a program set in advance in its control circuit (not shown). That is, the controlling part 50 performs not only the general operation control of the workpiece-separating device A including the ON/OFF control of the laser beams L emitted from the laser source 21 to irradiated the laser irradiation positions P but also various settings such as the setting of the various parameters of the laser beams L.

By the controlling part 50, the laser irradiation part 22 of the optical system 20 or the driving part 30 is caused to perform the irradiation of the laser beams L from the laser irradiation part 22 for each of the irradiation regions R with respect to the plurality of irradiation regions R obtained by dividing the supporting body 2 and the separating layer 3 of the layered body S held by the holding member 10 and perform control to make the irradiation angles of the laser beams L substantially perpendicular to the face of the supporting body 2 or the separating layer 3.

Besides this, the controller that serves as the controlling part 50 has input means 51, a displaying part (not shown), or the like such as a touch panel and is configured to be capable of setting the scanning distance of the laser irradiation part 22, the size of the plurality of irradiation regions R, the irradiation order of the laser beams L from the laser irradiation part 22 with respect to the plurality of irradiation regions R, or the like according to the operation of the input means 51.

The distance between the laser beams (Gaussian beams) L pulse-oscillated from the laser irradiation part 22 set by the controlling part 50, i.e., the distance D between the centers of the adjacent Gaussian beams is set to be less than three times of a standard deviation a when the relationship between a beam diameter and irradiation intensity in the beam profile of the Gaussian beams is assumed as a normal distribution by an experiment that will be described later.

In the case of an example shown in the figures about the Y direction perpendicular to the X direction in which the laser irradiation part 22 of the optical system 20 performs scanning, the distance D1 between the centers of the Gaussian beams adjacent to each other in the X direction is determined by the pulse control of the laser source 21 and the rotation control of the polygon scanner 22a. A distance D2 between the centers of the Gaussian beams adjacent to each other in the Y direction is determined by the pulse control of the laser source 21 and the relative moving control of the holding member 10 based on the driving part 30.

Figure 5A:
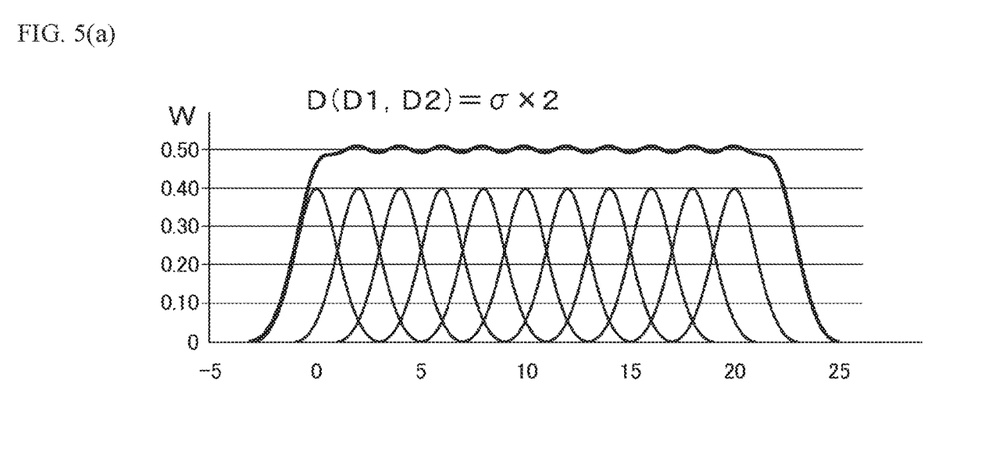
FIG. 5(a) shows a beam profile 2 times of a standard deviation.

In a case shown in FIG. 5(a), the distance D1 between the centers of the Gaussian beams adjacent to each other in the X direction is set to be twice of the standard deviation $\sigma$ when the relationship between the beam diameter and the irradiation intensity in the beam profile of the Gaussian beams is assumed as the normal distribution. Therefore, the laser irradiation positions P of the pulsed laser beams (Gaussian beams) L pulse-oscillated from the laser irradiation part 22 are deviated in the same scanning direction (X direction) by a distance 2.5 times of the standard deviation $\sigma$. Thus, the disturbance of irradiation intensity (beam intensity) combined by the adjacent Gaussian beams is almost eliminated.

Figure 5B:
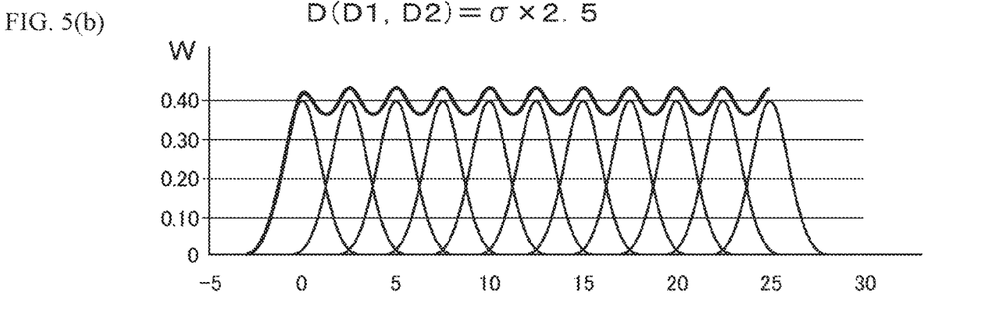
FIG. 5(b) shows a beam profile 2.5 times of the standard deviation.

In a case shown in FIG. 5(b), the distance D1 between the centers of the Gaussian beams adjacent to each other in the X direction is set to be 2.5 times of the standard deviation $\sigma$. Thus, the disturbance of irradiation intensity (beam intensity) combined by the adjacent Gaussian beams is reduced within about 90% of the irradiation intensity.

Figure 5C:
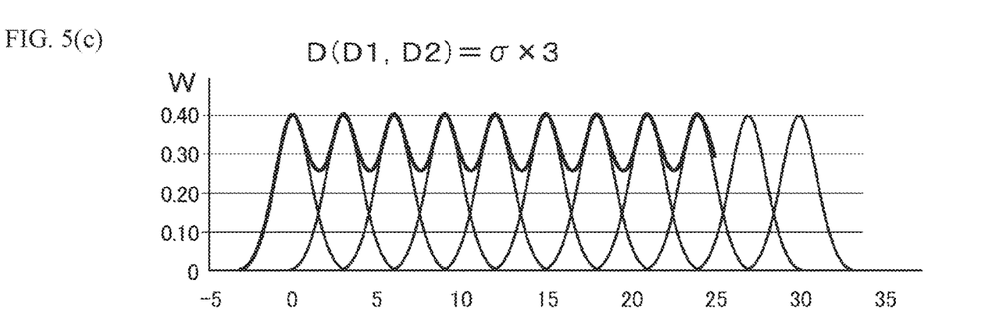
FIG. 5(c) shows a beam profile 3 times of the standard deviation.
Figure 6A:
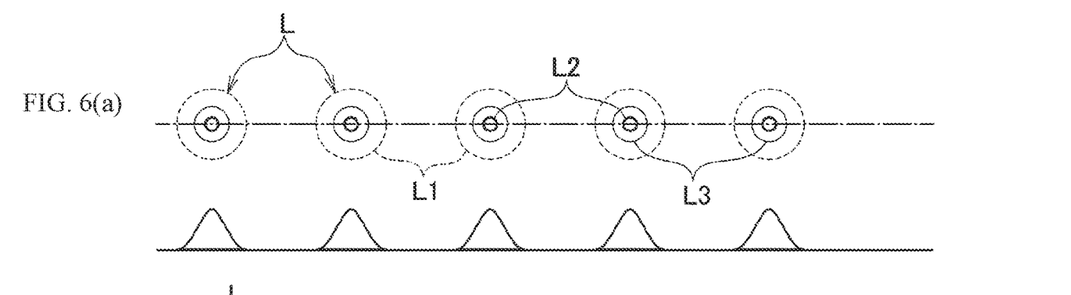
FIG. 6(a) is an explanatory view of the first irradiation.
Figure 6B:
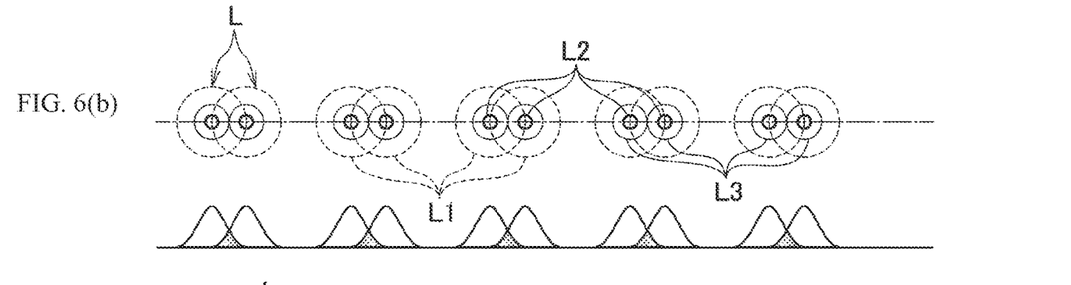
FIG. 6(b) is an explanatory view of the second irradiation.
Figure 6C:
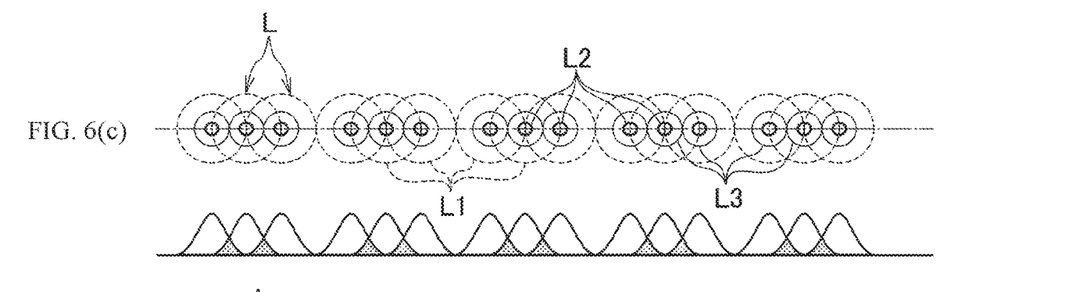
FIG. 6(c) is an explanatory view of the third irradiation.
Figure 6D:
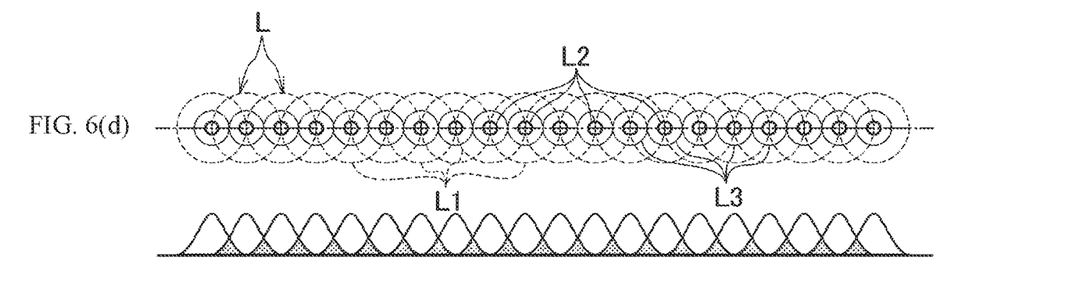
FIG. 6(d) is an explanatory view of the fourth irradiation.

In contrast, in a case shown in FIG. 5(c), the distance D1 between the centers of the Gaussian beams adjacent to each other in the X direction is set to be three times of the standard deviation $\sigma$. Thus, the irradiation intensity combined by the adjacent Gaussian beams is intensely disturbed. Therefore, the total energy of the pulsed laser beams L for irradiation becomes non-uniform within the face of the separating layer 3, and there is a possibility that partially excessively irradiated portions of the separating layer 3 are burned due to an increase in their temperatures to cause soot. On the contrary, in insufficiently irradiated portions, there is a possibility that the supporting body 2 cannot be peeled from the workpiece 1 of the layered body S in a subsequent separation process that will be described later.

It turned out by the above experimental results that the distance D1 between the centers of the adjacent Gaussian beams is preferably less than 3 times, specifically within about 2.5 times of the standard deviation $\sigma$.

Here, the "within about 2.5 times" is not limited to distances within 2.5 times but includes distances slightly larger than the distances of 2.5 times.

Further, like the distance D1 between the Gaussian beams adjacent to each other in the X direction, the distance D2 between the Gaussian beams adjacent to each other in the Y direction is also set to be less than three times of a standard deviation a when the relationship between a beam diameter and irradiation intensity in the beam profile of the Gaussian beams is assumed as a normal distribution.

In this case as well, it turned out by experimental results that the distance D2 between the centers of the adjacent Gaussian beams is preferably less than 3 times, specifically within about 2.5 times of the standard deviation $\sigma$.

Here, the "within about 2.5 times" is not limited to distances within 2.5 times but includes distances slightly larger than the distances of 2.5 times.

In addition, the distance D2 between the Gaussian beams adjacent to each other in the Y direction is preferably the same as the distance D1 between the Gaussian beams adjacent to each other in the X direction.

In addition, as shown in FIGS. 6(a) to 6(d), the irradiated point arrangement intermittently irradiated a plurality of times with the pulsed laser beams L (Gaussian beams) emitted from the laser irradiation part 22, i.e., a scanning distance and the number of scanning times in the scanning direction (X direction) based on the rotational driving of the polygon scanner 22a set by the controlling part 50 are set such that, when scanning is performed a plurality of times while the irradiated points of the pulsed laser beams L based on the rotational driving of the polygon scanner 22a are slightly deviated in the scanning direction (X direction), parts of the respective pulsed laser beams L overlap each other to be linearly connected.

More specifically, with respect to the pulsed laser beams L (Gaussian beams), the controlling part 50 performs control to make a plurality of the pulsed laser beams L linearly continuous by making outer peripheral parts L1 having low irradiation intensity (beam intensity) overlap each other, making central parts L2 having high irradiation intensity separate from each other, and making intermediate parts L3 between the outer peripheral parts L1 and the central parts L2 in contact with each other.

In a case shown in FIGS. 6(a) to 6(d) as a specific example of the irradiated point arrangement, the controlling part 50 makes the intermediate parts L3 continuous so as to be brought into contact with each other by arranging a plurality (four) of the pulsed laser beams L having the same beam diameter side by side in the scanning direction (X direction) with only the outer peripheral parts L1 overlapping each other.

Further, although not shown in the figures as another example, it is also possible to change the scanning distance and the number of scanning times to settings other than the example shown in the figures.

Next, the program set in the control circuit of the controlling part 50 will be described as the workpiece-separating method of the workpiece-separating device A.

The workpiece-separating method using the workpiece-separating device A according to the embodiment of the present invention includes as its main processes: a holding process of detachably holding the workpiece 1 of the layered body S on the holding part 10; a laser irradiation process of performing the irradiation of the laser beams L from the laser irradiation part 22 toward the separating layer 3 through the supporting body 2 of the layered body S held by the holding member 10; a relative moving process of relatively moving the laser irradiation positions P of the laser irradiation part 22 with respect to the supporting body 2 and the separating layer 3 of the layered body S held by the holding member 10 with the driving part 30 or the laser irradiation part (laser scanner) 22; and a separation process of peeling the supporting body 2 from the workpiece 1 of the layered body S.

In addition, the workpiece-separating method preferably includes as processes subsequent to the separation process: a cleaning process of removing a residue of the separating layer 3 remaining on the workpiece 1 having been separated from the separating layer 3 with a cleaning liquid; and a cutting-off process of cutting off the workpiece 1 after the cleaning process with a dicing or the like while holding the same with the holding member 10.

The residue of the separating layer 3 includes an adhesive agent or the like for adhering the workpiece 1 and the supporting body 2 to each other.

In the holding process, the layered body S before separation is carried in toward the holding member 10 by the operation of the carry-in mechanism (not shown) composed of a carrying robot or the like, and immovably held by the holding chuck 11 at a prescribed position on the holding face of the holding member 10.

In the laser irradiation process, the separating layer 3 is irradiated with the Gaussian beams pulse-oscillated as the laser beams L by the operations of the optical system 20 and the laser irradiation part 22 through the supporting body 2 toward the layered body S held by the holding member 10.

In the relative moving process, the layered body S held by the holding member 10 and the laser irradiation part 22 are relatively moved in the X and Y directions by the operation of the driving part 30 as shown in FIGS. 1 to 4.

On this occasion, the laser beams L are preferably irradiated from the laser irradiation part 22 for each of the irradiation regions R with respect to the plurality of irradiation regions R divided to be smaller than the whole irradiated face of the supporting body 2 and the separating layer 3. Concurrently with this, the irradiation angles of the laser beams L irradiated from the laser irradiation part 22 for each of the irradiation regions R are held to be substantially perpendicular. Finally, all the plurality of irradiation regions R are irradiated with the laser beams L.

Thus, each of the unit irradiation regions R is uniformly irradiated with the laser beams L. Therefore, the laser beams L are finally emitted for irradiation without causing irradiation unevenness over the whole face of the separating layer 3, and the whole face of the separating layer 3 alters to make the workpiece 1 and the supporting body 2 peelable.

In the separation process, the supporting body 2 is peeled and separated from the workpiece 1 of the layered body S held by the holding member 10 by the operation of the peeling mechanism (not shown) that holds and peels the supporting body 2 from the layered body S after light irradiation.

After the separation process, the workpiece 1 after the separation is removed from the holding face of the holding member 10 and carried out by the operation of the carrying-in mechanism (not shown) composed of the carrying robot or the like.

After that, the above processes are repeatedly performed.

In the workpiece-separating device A and the workpiece-separating method according to the embodiment of the present invention described above, the layered body S held by the holding member 10 is irradiated with the laser beams L pulse-oscillated emitted from the laser irradiation part 22 with the distance D between the adjacent Gaussian beams deviated less than three times of the standard deviation C.

Thus, as shown in FIGS. 5(a) and 5(b), the disturbance of irradiation intensity (beam intensity) combined by the adjacent Gaussian beams is reduced within about 90% of the irradiation intensity. Therefore, the total energy of the emitted pulsed laser beams L for irradiation becomes substantially uniform within the face of the separating layer 3.

Accordingly, the separating layer 3 of the layered body S can be uniformly irradiated with the pulsed laser beams L.

As a result, compared with a conventional art in which a separating layer is partially burned to easily cause soot when scanning is performed in a state in which the energy of pulsed laser beams is excessively larger in amount than a required amount for separating the separating layer, heat generation accompanied by laser irradiation is reduced to a minimum level without excessively applying irradiation energy to the separating layer 3. Therefore, a burn or soot caused by the excessive irradiation of the laser beams L can be prevented, and high-accuracy laser peeling can be realized under a clean environment.

Thus, damage on a device formed in the circuit board of the workpiece 1 can be prevented, and a high-quality product can be manufactured. As a result, an improvement in yield is achieved.

In addition, the conventionally-generally-used Gaussian beams can be used as they are for uniform irradiation without performing an optical conversion by a beam profiler or the like. Therefore, the optical system 20 can be simply formed without shortening its service life, and the simplification of the structure of the whole device is achieved.

Further, compared with the conventional art in which the beam profile of the Gaussian beams is changed to the pseudo top hat with the diffraction optical element (DOE) as shown in FIG. 4(b), excessive pulse power is not generated even if the laser irradiation positions P are slightly deviated as shown in FIG. 4(a). Therefore, substantially uniform irradiation can be achieved at all the laser irradiation positions P, and problems such as a burn and soot caused by the excessive irradiation of the laser beams L can be reduced.

Particularly, as shown in FIGS. 6(a) to 6(d), the controlling part 50 preferably performs the irradiation of the laser beams L pulse-oscillated from the laser irradiation part 22 on the separating layer 3 of the layered body S held by the holding member 10 a plurality of times intermittently at a prescribed distance in the linear direction (X direction) along the irradiated face of the separating layer 3 and controls the laser beams L to irradiate the plurality of laser irradiation positions P so as to be partially overlap each other to be continuous in the linear direction (X direction).

In this case, the scanning is performed a plurality of times while the irradiated points of the pulsed laser beams L are slightly deviated in the scanning direction (X direction) of the laser irradiation part (laser scanner) 22 by the laser irradiation part (laser scanner) 22. Thus, it is possible to perform a setting to make parts of the respective pulsed laser beams L overlap each other to be linearly connected.

Accordingly, local heat generation can be reduced along the same line of the separating layer 3.

As a result, a burn or soot caused by the excessive irradiation of the laser beams L can be reliably prevented, and high-accuracy laser peeling can be realized under a cleaner environment.

Therefore, a higher-quality product can be manufactured, and a further improvement in yield is achieved.

In addition, the workpiece-separating method preferably includes as processes subsequent to the laser irradiation process: a separation process of separating the supporting body 2 from the layered body S after the laser irradiation process; and a cleaning process of removing a residue of the separating layer 3 remaining on the workpiece 1 having been separated from the layered body S with a cleaning liquid.

In this case, foreign matter like soot is not mixed in the cleaning liquid even when a residue of the separating layer 3 remaining on the workpiece 1 is removed by the cleaning liquid in the cleaning process performed after laser peeling.

Accordingly, the contamination of the cleaning liquid due to the mixture of foreign matter like soot can be completely prevented.

As a result, the service life of the cleaning liquid is increased, dust can be prevented from being adhered from the cleaning liquid to the workpiece 1 again, a higher-quality product can be manufactured, and a further improvement in yield is achieved.

Note that the workpiece 1 and the supporting body 2 are bonded to each other by the separating layer 3 formed of a material having an adhesive property in the above embodiment. Besides this, when the separating layer 3 formed of a material having no adhesive property is used, the separating layer 3 and the supporting body 2 may be adhered to each other by the provision of an adhesive layer (not shown) formed of an adhesive agent between the separating layer 3 and the supporting body 2 as disclosed in PTL 1.

In addition, the example shown in the figures shows the workpiece-side moving type that mainly moves the side of the layered body S with the optical-axis relative moving mechanism that serves as the driving part 30. Besides this, the optical-axis-side moving type that moves the laser irradiation part 22 with the driving part 30 provided in only a part of the optical system 20 may be employed.

In this case, a Galvano scanner that moves a reflecting mirror (Galvano mirror) is provided as scanning means instead of the polygon scanner 22a that serves as the laser irradiation part 22. By the operation of the Galvano scanner that serves as the driving part 30, the holding member 10 is not moved but the reflecting mirror (Galvano mirror) that serves as the laser irradiation part 22 is moved instead of the polygon scanner 22a, whereby it is possible to move the laser irradiation positions P of the laser irradiation part 22 in the X and Y directions.

REFERENCE SIGNS LIST

A Workpiece-separating device
S Layered body
1 Workpiece
2 Supporting body
3 Separating layer
10 Holding member
20 Optical system
22 Laser irradiation part
50 Controlling part
L Laser beam
P Laser irradiation position
D Distance
σ Standard deviation

The invention claimed is:

1. A workpiece-separating device comprising:
a holding member that detachably holds a workpiece in a layered body in which the workpiece that includes a circuit board and a supporting body that allows laser beams to pass therethrough are layered with each other via a separating layer that peelably alters with absorption of the laser beams;
a laser irradiation part that performs irradiation of the separating layer with Gaussian beams pulse-oscillated as the laser beams through the supporting body of the layered product held by the holding member; and
a controlling part that controls an operation of the laser irradiation part, wherein
the controlling part controls a distance between centers of the adjacent Gaussian beams of the laser beams pulse-oscillated from the laser irradiation part to be less than three times of a standard deviation when a relationship between a beam diameter and irradiation intensity in a beam profile of the Gaussian beams is assumed as a normal distribution.

2. The workpiece-separating device according to claim 1, wherein
the controlling part performs irradiation of the separating layer of the layered body held by the holding member with the laser beams pulse-oscillated from the laser irradiation part a plurality of times intermittently at a prescribed distance in a linear direction along an irradiated face of the separating layer and controls the laser beams to irradiate a plurality of laser irradiation positions so as to be overlap each other to be continuous in the linear direction.

3. A workpiece-separating method comprising:

a holding process of detachably holding a workpiece on a holding member in a layered product wherein the workpiece that includes a circuit board and a supporting body that allows laser beams to pass therethrough are layered with each other via a separating layer that peelably alters with absorption of the laser beams; and a laser irradiation process of irradiating the separating layer with the laser beams emitted from the laser irradiation part through the supporting body of the layered body held by the holding member, wherein, in the laser irradiation process, Gaussian beams pulse-oscillated as the laser beams are emitted from the laser irradiation part for irradiation, and a distance between centers of the adjacent Gaussian beams is set to be less than three times of a standard deviation when a relationship between a beam diameter and irradiation intensity in a beam profile of the Gaussian beams is assumed as a normal distribution.

4. The workpiece-separating method according to claim 3, further comprising as processes subsequent to the laser irradiation process:

a separation process of separating the supporting body from the layered body subsequent to the laser irradiation process; and a cleaning process of removing residues of the separating layer remaining on the workpiece separated from the layered body with a cleaning liquid.

* * * * *

UNITED STATES PATENT AND TRADEMARK OFFICE
CERTIFICATE OF CORRECTION

PATENT NO. : 10,840,141 B2
APPLICATION NO. : 16/755341
DATED : November 17, 2020
INVENTOR(S) : Y. Ohtani et al.

It is certified that error appears in the above-identified patent and that said Letters Patent is hereby corrected as shown below:

Column 15, Line 2 (Claim 2, Line 10) please change "to be overlap" to -- to overlap --.

Signed and Sealed this
Twenty-third Day of March, 2021

Drew Hirshfeld
*Performing the Functions and Duties of the*
*Under Secretary of Commerce for Intellectual Property and*
*Director of the United States Patent and Trademark Office*